United States Patent
Rivkin et al.

(10) Patent No.: US 11,593,636 B1
(45) Date of Patent: Feb. 28, 2023

(54) MACHINE LEARNING SYSTEM UTILIZING MAGNETIZATION SUSCEPTIBILITY ADJUSTMENTS

(71) Applicant: Seagate Technology LLC, Cupertino, CA (US)

(72) Inventors: Kirill A. Rivkin, Bloomington, MN (US); Javier Guzman, Bloomington, MN (US); Mourad Benakli, Bloomington, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 1045 days.

(21) Appl. No.: 16/238,847

(22) Filed: Jan. 3, 2019

(51) Int. Cl.
| | | |
|---|---|---|
| *G06N 3/08* | (2006.01) | |
| *G06N 3/063* | (2023.01) | |
| *G01R 33/12* | (2006.01) | |
| *G01R 33/16* | (2006.01) | |
| *H01F 10/32* | (2006.01) | |

(52) U.S. Cl.
CPC ........... *G06N 3/08* (2013.01); *G01R 33/1284* (2013.01); *G01R 33/16* (2013.01); *G06N 3/0635* (2013.01); *H01F 10/329* (2013.01)

(58) Field of Classification Search
CPC .... G06N 3/08; G06N 3/0635; G01R 33/1284; G01R 33/16; H01F 10/329
See application file for complete search history.

(56) References Cited

U.S. PATENT DOCUMENTS

| | | | |
|---|---|---|---|
| 6,735,336 B2 | 5/2004 | Avni et al. | |
| 8,495,118 B2 * | 7/2013 | Wang | G06F 7/588 |
| | | | 365/158 |
| 8,897,047 B2 | 11/2014 | Bourianoff et al. | |
| 9,110,771 B2 | 8/2015 | Hoppensteadt et al. | |
| 9,582,695 B2 | 2/2017 | Hoppensteadt et al. | |
| 9,739,851 B2 | 8/2017 | Hoppensteadt et al. | |
| 2005/0163384 A1 | 7/2005 | Avni et al. | |
| 2012/0062220 A1 | 3/2012 | Hoppensteadt et al. | |
| 2017/0039472 A1 | 2/2017 | Kudo | |

FOREIGN PATENT DOCUMENTS

| | | |
|---|---|---|
| WO | 2017/111688 A1 | 6/2017 |
| WO | 2018/084774 A1 | 5/2018 |

OTHER PUBLICATIONS

Karthik Yogendra et al., "Coupled Spin Torque Nano Oscillators for Low Power Neural Computation", IEEE Transactions on Magnetics, vol. 51, No. 10, Oct. 2015 (Year: 2015).*

Z. Li et al., "Magnetization dynamics with a spin-transfer torque", ©2003 The American Physical Society, published Jul. 2, 2003 (Year: 2003).*

(Continued)

*Primary Examiner* — Michael J Huntley
*Assistant Examiner* — Imad Kassim
(74) *Attorney, Agent, or Firm* — Westman, Champlin & Koehler, P.A.

(57) ABSTRACT

A machine learning system and method. The machine learning system includes at least one computation circuit that performs a weighted summation of incoming signals and provides a resulting signal. The weighted summation is carried out at least in part by a magnetic element in which weights are adjusted based on changes in effective magnetic susceptibility of the magnetic element.

20 Claims, 4 Drawing Sheets

(56) References Cited

OTHER PUBLICATIONS

R. Khatiwada et al., "Materials with low DC magnetic susceptibility for sensitive magnetic measurements", physics.ins-det, Jul. 1, 2015) (Year: 2015).*

Nikonov et al. ("Overview of Beyond-CMOS Devices and a Uniform Methodology for Their Benchmarking," in Proceedings of the IEEE, vol. 101, No. 12, pp. 2498-2533, Dec. 2013) (Year: 2013).*

Wang et al. ("Magnetization logarithmic susceptibility, damping parameter, and dynamics symmetry extraction" Appl. Phys. Lett. 93, 182506 (2008)) (Year: 2008).*

Zhang et al. "All Spin Artificial Neural Networks Based on Compound Spintronic Synapse and Neuron", IEEE Transactions on Biomedical Circuits and Systems, vol. 10, No. 4, Aug. 2016. (Year: 2016).*

Adly et al. "Utilizing neural networks in magnetic media modeling and field computation: A review", Journal of Advanced Research, vol. 5, Issue 6, Nov. 2014, pp. 615-627. (Year: 2014).*

Mohdeb et al. "Determination of the relative magnetic permeability by using an adaptive neuro fuzzy inference system and 2d-fem", Progress in Electromagnetics Research B, vol. 22, pp. 237-255, 2010. (Year: 2010).*

Wu et al. "Enhanced Magnetic Localization with Artificial Neural Network Field Models", May 6-10, 2013 IEEE, pp. 1560-1565. (Year: 2013).*

Shevkoplyas et al. "The force acting on a superparamagnetic bead due to an applied magnetic field", Lab Chip, Jul. 25, 2007, 7, 1294-1302. (Year: 2007).*

Karthik Yogendra et al., "Coupled Spin Torque Nano Oscillators for Low Power Neural Computation", IEEE Transactions on Magnetics, vol. 51, No. 10, Oct. 2015, 9 pages.

Jacob Torrejon et al., "Neuromorphic computing with nanoscale spintronic oscillators", Nature, vol. 547, Jul. 27, 2017, © 2017 Macmillan Publishers Limited, part of Springer Nature, 5 pages.

L. Appeltant et al., "Information processing using a single dynamical node as complex system", published Sep. 13, 2011, Nature Communications, 2:468, DOI: 10.1038/ncomms1476, www.nature.com/naturecommunications, © 2011 Macmillan Publishers Limited, 6 pages.

Tamas Roska et al., "An Associative Memory with Oscillatory CNN Arrays using Spin Torque Oscillator Cells and Spin-Wave Interactions, Architecture and End-to-end Simulator", 978-1-4673-0289-0/12/$31.00 © 2012 IEEE, 3 pages.

* cited by examiner

MACHINE LEARNING SYSTEM UTILIZING MAGNETIZATION SUSCEPTIBILITY ADJUSTMENTS

SUMMARY

In one embodiment, a machine learning system is provided. The machine learning system includes at least one computation circuit configured to perform a weighted summation of incoming signals and provide a resulting signal. The weighted summation is carried out at least in part by a magnetic element in which weights are adjusted based on changes in effective magnetic susceptibility of the magnetic element.

In another embodiment, a method is provided. The method includes performing neural network task processing by adjusting weights of the neural network based on changes in effective magnetic susceptibility of a magnetic element.

In yet another embodiment, an artificial intelligence processing block is provided. The artificial intelligence processing block comprises a magnetic element in which weights are adjusted based on changes in effective magnetic susceptibility of the magnetic element.

Other features and benefits that characterize embodiments of the disclosure will be apparent upon reading the following detailed description and review of the associated drawings.

DETAILED DESCRIPTION OF ILLUSTRATIVE EMBODIMENTS

Figure 1:
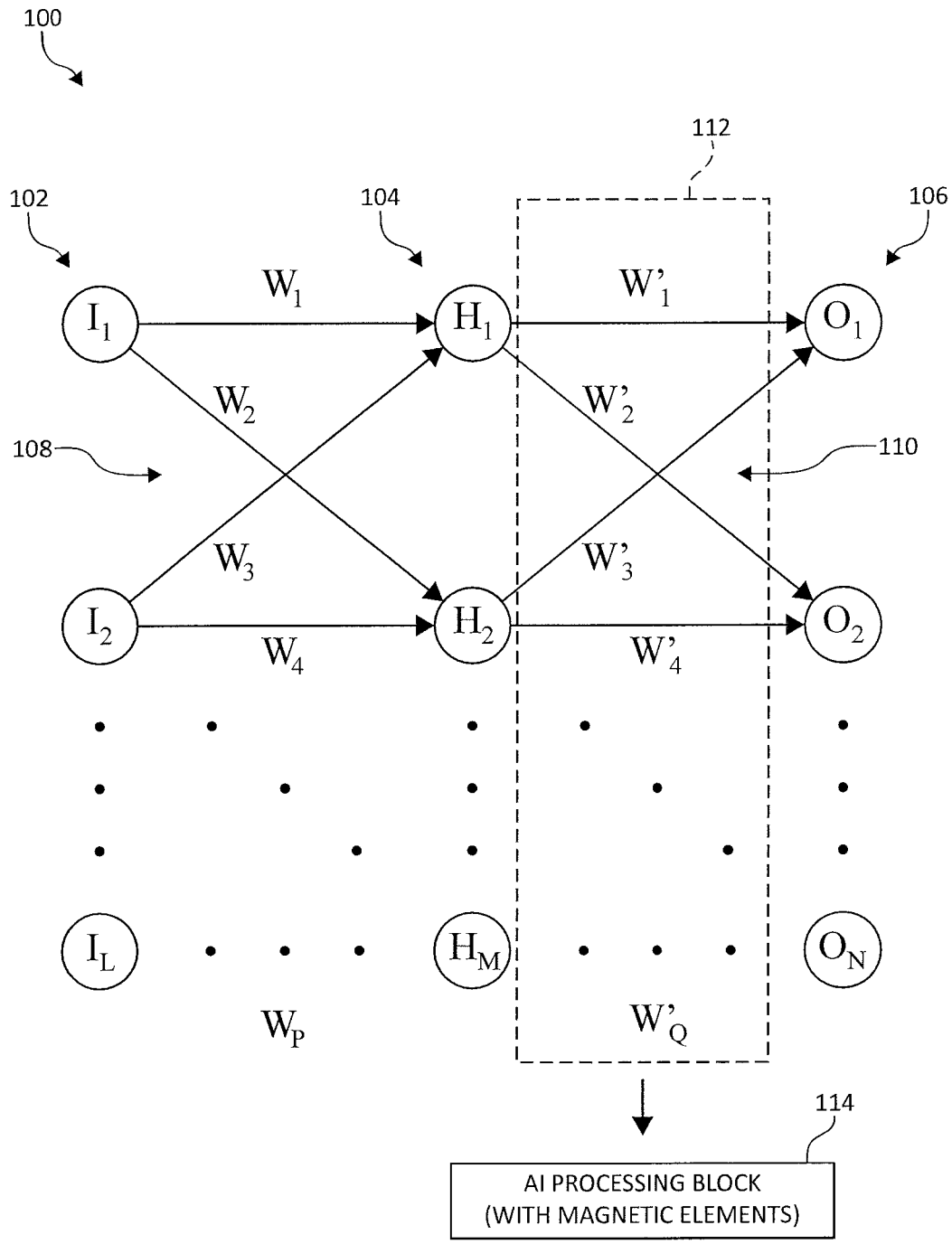
FIG. 1 is a diagrammatic illustration of an example of a general architecture of a neural network, and a processing block in accordance with one embodiment.

Embodiments of the disclosure generally relate to machine learning or artificial intelligence (AI) systems that have the ability to automatically learn and improve from experience without being explicitly programmed. Example embodiments described further below provide artificial intelligence processing blocks that employ magnetization susceptibility or permeability adjustments to carry out machine learning system computations. Prior to describing the different embodiments, a general description machine learning systems is provided below.

Many implementations of machine learning systems include a multi-layer design, where each layer includes nodes that perform a linearly weighted summation of incoming signals (e.g., spin waves or alternating current) and then, depending on an internal threshold function, relay a resulting signal (with, for example, values between zero and one) to a next layer of nodes. It is common that each node from one layer collects the signals from all nodes of the previous layer. A final or output layer may include a small number of output nodes from which a resulting signal (classification, prediction, etc.) is read. During a learning mode of the system, the resulting signal that is read is compared against a desired result, and then proportional corrections are implemented. Most commonly, the corrections are limited to adjustments of individual weights in proportion to the difference between the obtained and desired results. An example of a general architecture of a neural network is provided below in connection with FIG. 1.

It should be noted that like reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

FIG. 1 is a diagrammatic illustration of an example of a general architecture of a neural network. Neural network 100 of FIG. 1 includes an input layer 102, a hidden layer 104 and an output layer 106. In the interest of simplification, only one hidden layer 104 is shown. However, in different artificial intelligence systems, any suitable number of hidden layers 104 may be employed. Input layer 102 includes input nodes $I_1$-$I_L$, hidden layer 104 includes hidden nodes $H_1$-$H_M$ and output layer 106 includes output nodes $O_1$-$O_N$. Connections 108 and 110 are weighted relationships between nodes of one layer to nodes of another layer. Weights of the different connections are represented by $W_1$-$W_P$ for connection 108 and $W'_1$-$W'_Q$ for connections 110.

Embodiments of the disclosure provide a hardware device solution for carrying out at least some of computations associated with neural network architecture 100. After designing the neural network 100 and providing a hardware solution for the network 100, the network 100 is typically initialized. Initialization of the neural network 100 may involve initializing all weights $W_1$-$W_P$ and $W'_1$-$W'_Q$ to any suitable preliminary values. The initialized neural network 100 is then trained by providing input values (e.g., input signals) to input nodes $I_1$-$I_L$, obtaining resulting output signals from output nodes $O_1$-$O_N$, comparing the resulting output signal to a desired result, and then adjusting weights $W_1$-$W_P$ and $W'_1$-$W'_Q$ based on a difference between the output signal and the desired result.

Embodiments of the disclosure provide artificial intelligence processing blocks that include magnetic elements in which at least some of the computations of a neural network such as 100 are carried out. For example, in FIG. 1, weight adjustments in portion 112 of neural network 100 may be carried out by an artificial intelligence processing block 114, which is a computation circuit that includes magnetic elements in which the weights (e.g., $W'_1$-$W'_Q$) are adjusted/updated based on changes in effective magnetic susceptibility or permeability caused by a partial change in a magnetization direction (usually amounting to partial reversal) of signal lines that are used for spin wave transmission in the magnetic elements. This in turn is caused by an interaction between the magnetization and spin waves that travel through the magnetic element (e.g., a resonant excitation by the spin waves tuned in frequency to the magnetization reversal (microwave assisted magnetic reversal (MAMR)) resonance). Such effects are confined to a specific section of the magnetic element by the local interference between spin waves (for example, those traveling from an input detector to the outputs and those traveling in the opposite direction), by adjusting the spin waves' frequency, or by adjusting other parameters (e.g., external magnetic field). The implementations assume the existence of at least two operational modes—a "learning mode", during which high amplitude spin waves are used and thus the element's magnetization is impacted, and a "performance mode", where the spin waves' amplitude is substantially decreased so that there is no unwanted magnetization reversal. Details of an example artificial intelligence processing block are provided below in connection with FIG. 2A.

Figure 2A:
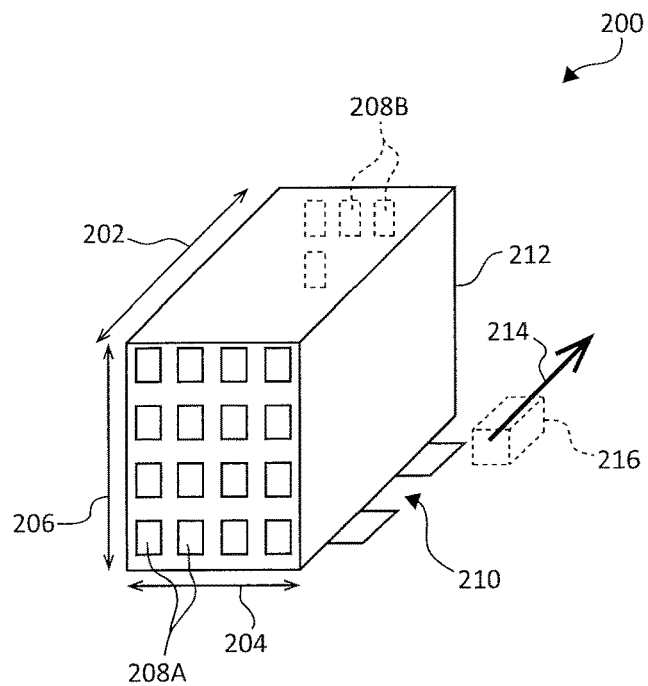
FIG. 2A is a perspective view of an artificial intelligence processing block which employ a magnetic element in accordance with one embodiment.

FIG. 2A is a perspective view of an artificial intelligence processing block 200 which employs magnetic elements in accordance with one embodiment. In the example shown in FIG. 2A, processing block 200 is a rectangular magnetic block that may have any suitable length 202, width 204 and height 206 dimensions (e.g., length 202 of about 1000 nanometers (nm), width 204 of about 600 nm and height 206 of about 600 nm). In FIG. 2A, a front portion of processing block 200 includes a plurality spin torque oscillators (STOs) 208A (or any other suitable alternating magnetic field generators) that may be arranged in a manner shown. A back portion of processing block 200 may also include a plurality of similarly-arranged STOs 208B. A bottom portion of the processing block 200 may include an array of magnetic sensors or detectors 210. The detectors 210 may be magnetic readers, STOs or other devices that are capable of measuring spin accumulation. STOs 208A, 208B and any detector STOs 210 may each include a reference layer (RL) and a free layer (FL) with the FL having dimensions 40×40×15 nm, for example. The remaining portion 212 of processing block 210 includes a ferromagnetic material having an anisotropy field ($H_k$), for example, between about 200 Oersted (Oe) and about 500 Oe. An external magnetic field 214 that may be substantially below a coercivity ($H_c$) of the ferromagnetic material 212 may be applied to processing block 200 by an external field application component 216. Temperature may also be used to control magnetization reversal and thus the operation of the device.

Figure 2B:
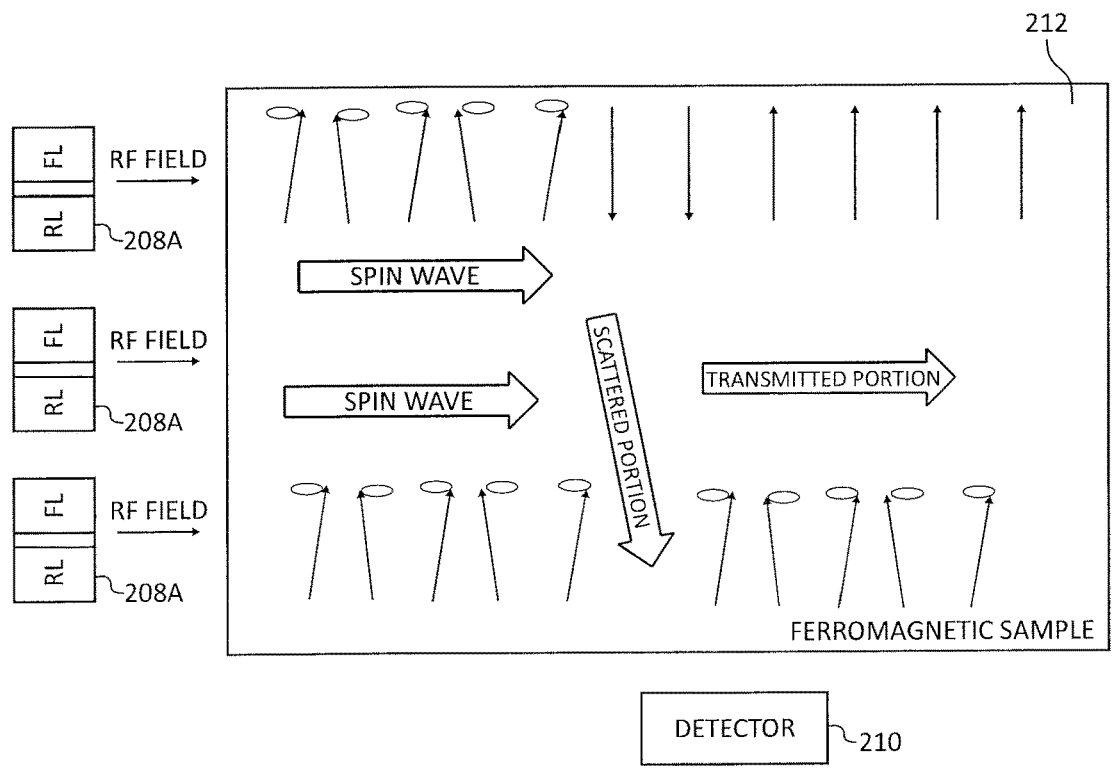
FIG. 2B is a diagrammatic illustration showing scattering of spin waves in a ferromagnetic material.

FIG. 2B is a diagrammatic illustration showing scattering of spin waves in ferromagnetic material 212. A resonant frequency of spin waves generated by STO array 208A, for example, reverses the magnetization in specific portions of ferromagnetic material 212, which increases or decreases the scattering of relatively low amplitude spin waves towards detectors 210. In FIG. 2B, STO array 208A serves as an "input layer" in which individual STO devices comprising array 208A may be activated by external sensors or other inputs or may be activated by output sensors (e.g., sensors of a detector layer) of a previous block (e.g., detectors such as 210 included in a different processing block connected to processing block 200). Alternatively, the STOs 208A may be activated by both the detector layer of previous block and an input layer of the current block 200, which may be achieved by STO synchronization between the input and detector layers. The connections between blocks may be magnetic (spin wave based) or based on combining STO-enabled processing blocks with more "conventional" electronic components. Details regarding the operation of a machine learning system including processing blocks such as 200 are provided below in connection with FIG. 3.

Figure 3:
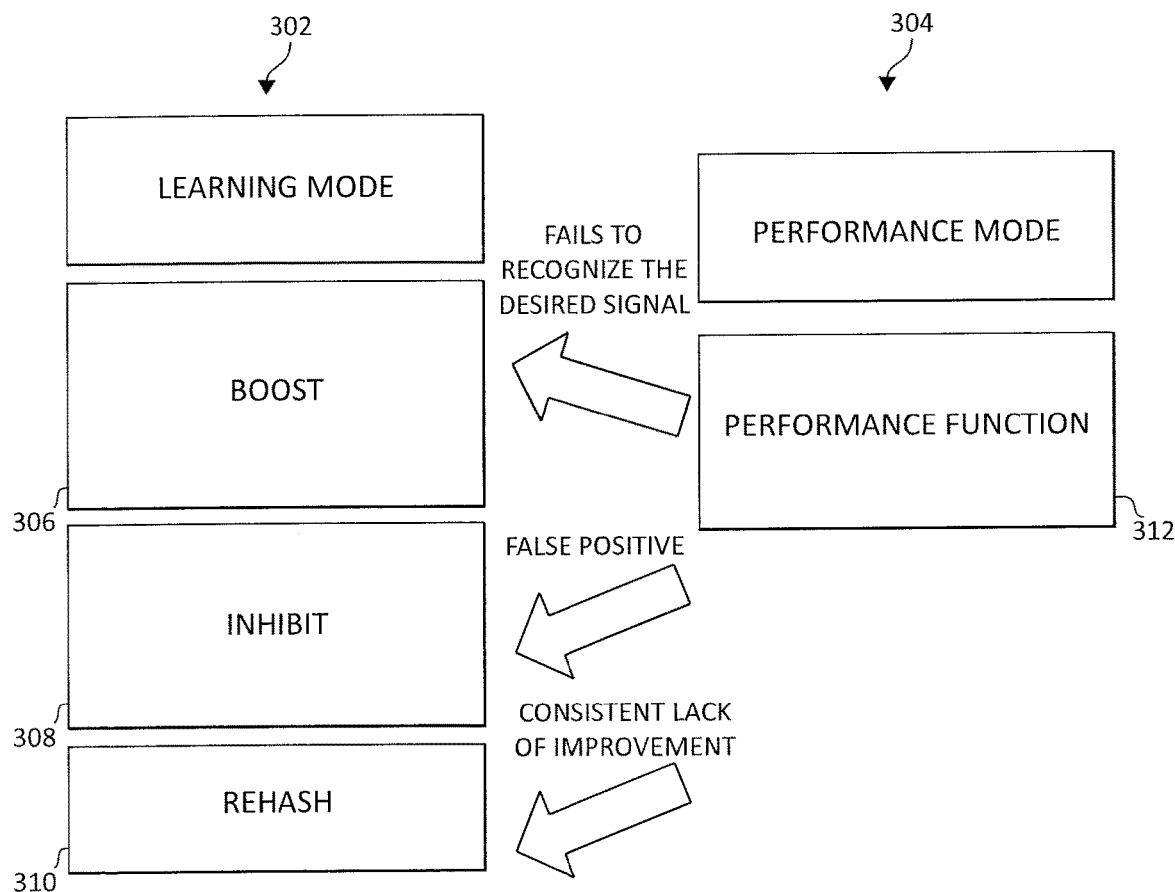
FIG. 3 is a diagrammatic illustration showing operational modes of a machine learning system implemented using one or more processing blocks in accordance with one embodiment.

FIG. 3 is a diagrammatic illustration showing operational modes of a machine learning system implemented using one or more processing blocks such as 200 (of FIG. 2A) in accordance with one embodiment. As can be seen in operational process 300 of FIG. 3, the operational modes include a learning mode 302 and a performance mode 304. It should be noted that, in the machine learning system that employs processing block 200 (of FIG. 2A), a substantial portion of the weighted summation is performed by spin wave interference within ferromagnetic material 212 (of FIGS. 2A and 2B) itself. The spin wave interference mechanism is setup in the learning mode 302 using relatively high amplitude spin waves and then executed in the performance mode 304 with relatively low amplitude spin waves. During the learning mode or phase 302, as indicated above, the resonant frequency of the spin waves (generated by arrays of STOs (such as 208A of FIGS. 2A and 2B), for example) reverses the magnetization in specific portions of the ferromagnetic material 212 (of FIG. 2A), consequently increasing or decreasing the scattering of much lower amplitude ("signal") spin waves towards certain areas (e.g., detectors 210 of FIGS. 2A and 2B). The frequency and the amplitude of spin waves in the learning mode 302 can be adjusted based on the results obtained during the performance mode 304.

In the learning mode 302, there are different possible operations, which either boost 306 (e.g., increase the relative weights of activated STOs) or inhibit 308 the signal, or reset (rehash 310) some of the reversed magnetization. The boost operation 306 reverses magnetization to increase scattering towards the detectors (e.g., 210 of FIGS. 2A and 2B), and the inhibit operation 308 reverses magnetization to reduce scattering towards the detectors (e.g., 210 of FIGS. 2A and 2B). The boost 306, inhibit 308 and rehash 310 operations, have different associated frequencies (e.g., boost operation 306 between 4 and 10 gigahertz (GHz), inhibit operation 308 between 2 and 3 GHz, and rehash operation 310 between 1 and 2 GHz). The different frequencies correspond to different magnetization patterns in the ferromagnetic material (e.g., 212 of FIGS. 2A and 2B) becoming resonant and thus responding to the spin waves created by STO radiation. Typically, very low frequencies correspond to topological isolated structures such as end modes or domain walls (DWs) and may be responsible for DW motion. The rehash operation 310 tries to move DWs towards edges of the ferromagnetic material and likely annihilates the DWs, thereby creating a more uniform magnetization (e.g., returning the system close to its original (e.g., initial) conditions). Long wavelength modes reverse the magnetization in large and wide patterns, which is beneficial for scattering towards the bottom or top of the ferromagnetic material rather than towards the side. Accordingly, the boost operation 306 frequency matches MAMR frequency of long wavelength modes in a lateral direction (e.g., perpendicular to an initial magnetization direction of the ferromagnetic material 212 of FIG. 2A). The inhibit operation 308 frequency matches MAMR frequency of long wavelength modes in a downward direction (e.g., parallel to an initial magnetization direction of the ferromagnetic material 212 of FIG. 2A).

Figure 4A:
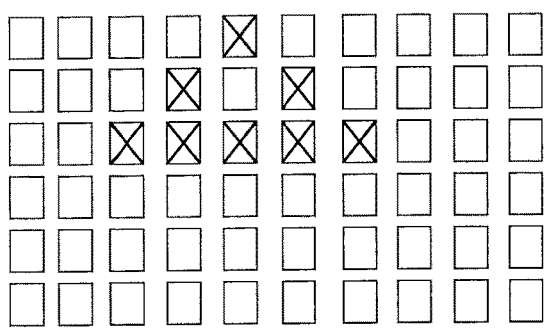
FIG. 4A is a diagrammatic illustration showing an example of a desired triangular pattern.

As indicated above, in operational mode 304, the amplitude of the spin waves is substantially less than in the learning mode 302. The operational mode 304 frequency is above MAMR frequency (e.g., 12-15 GHz). The operational mode 304 measures scattering towards detectors 210 (of FIGS. 2A and 2B). As can be seen in FIG. 3, when the system fails to recognize the desired signal in the operational mode 304, the boost operation 306 may be carried out. When a false positive is determined by the system, the inhibit operation 308 may be carried out. If there is a substantially consistent lack of improvement in desired signal recognition by the system, rehash operation 310 may be carried out. An example of an artificial intelligence processing blocks such as 200 (of FIG. 2A) functioning as an image recognition system is described below in connection with FIGS. 4A, 4B and 4C.

Figure 4B:
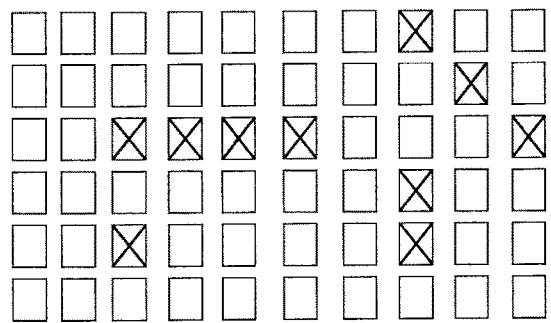
FIG. 4B is a diagrammatic illustration showing an example of a non-triangular random pattern.

In the example image recognition system, which employs a processing block such as 200 (of FIG. 2A), a goal is to teach the system to carry out shape recognition (e.g., training the block such as 200 to distinguish between a desired or "right" signal (e.g., STO's activated in a triangular pattern shown in FIG. 4A) and a random or "wrong" signal (e.g., STO's activated in a non-triangular pattern shown in FIG. 4B). In the example, an algorithm generates nodes with connections between them, and each activated STO is supplied a current. A sequence of signals that are to be "recognized" or "suppressed" by the system are applied in a "learning mode," and a "performance mode" may be intermittently used to determine the processing block's convergence.

A specific algorithm of programming the processing block such as 200 may include a set of rules to apply the allowed operations (e.g., operations shown in FIG. 3). These may include rules for choosing signal amplitudes and frequencies of STOs for signals belonging to different categories to be distinguished ("learning" stage), which may be combined with applying an external magnetic field to the processing block. Further, rules may be formulated for the algorithm to be adjusted depending on the tested ability of the system to perform the desired function. For example, if the quality of the obtained results consistently decreases over a few learning iterations, the external field can be used to "erase" the system by re-aligning its magnetization and restarting the whole process with new rules for choosing frequencies, amplitudes or other parameters. It may also be possible to utilize specific frequencies, amplitudes, and an external field to substantially alter the existing magnetization in the processing block to partially reset the system.

Figure 4C:
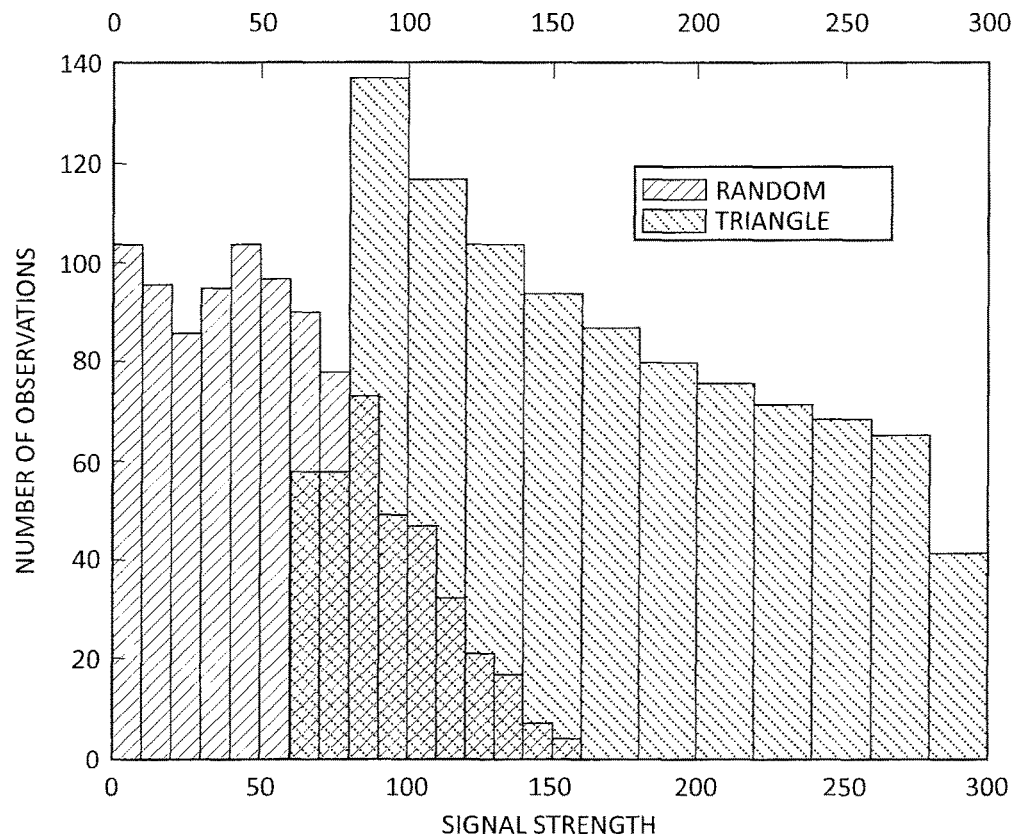
FIG. 4C illustrates a graph of results obtained after learning iterations for random figures and triangles.

FIG. 4C illustrates a graph of results obtained after 1000 learning iterations (up to 10 nanoseconds each) for 1000 random figures and 1000 triangles. In FIG. 4C, a horizontal axis represents signal strength and a vertical axis represents a number of observations. The signal strength is magnetization precession excited in the detector layer, which in a particular implementation may be measured through spin accumulation. The units of signal strength in FIG. 4C are arbitrary, but are physically identical to the chosen unit for saturation magnetization. The number of observations refers to a number of experiments where either a triangle or other random figure was provided to the system. The signal strengths are utilized to distinguish between the triangles and the other random figures. As can be seen in FIG. 4C, there is some overlap in signal strengths for triangles and other random figures, which may be addressed with additional resolution.

Figure 5:
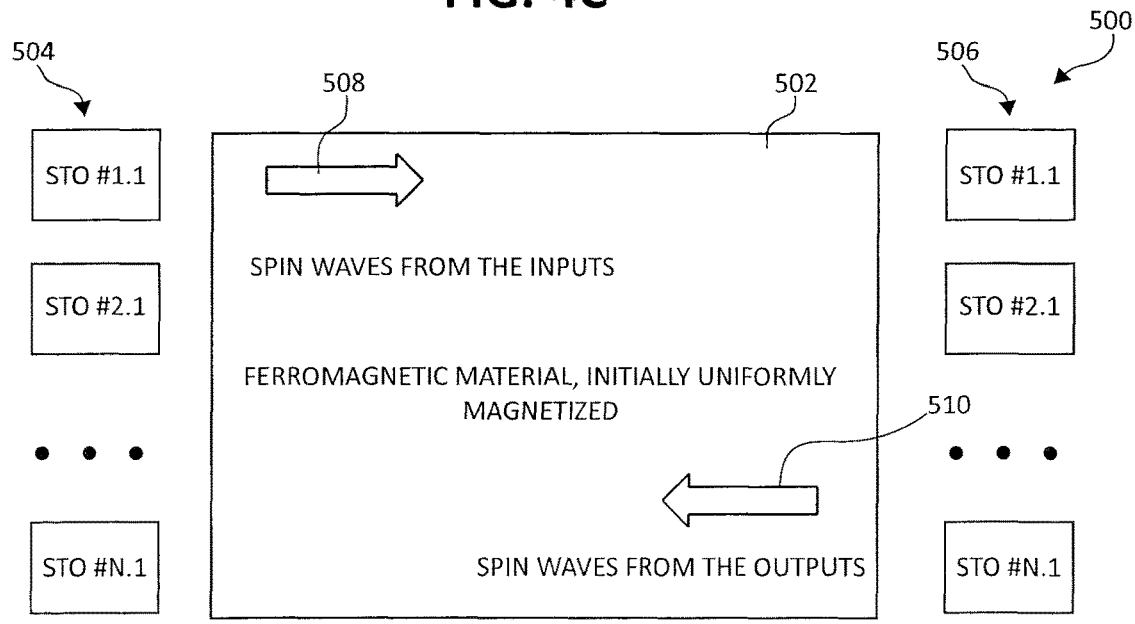
FIG. 5 is a diagrammatic illustration of a general embodiment.

FIG. 5 is a diagrammatic illustration of a general embodiment. FIG. 5 is included to illustrate that magnetization switching occurs when forward and backward traveling spin wave packets are synchronized in time in a given area. Device 500 of FIG. 5 includes ferromagnetic material 502, an array of input STOs 504, and an array of output STOs 506. Here, interference is between forward (e.g., traveling towards an output layer) spin waves, such as 508, and those reflected from downstream nodes (e.g., spin waves 510). Spin waves may have a duration substantially exceeding that of a single period, or may contain a short packet of just a few periods. In both cases, synchronization between the "input" and "output" spin waves is relied upon, for example with positive interference corresponding to an activated MAMR effect, and therefore partial magnetization reversal and thus reduced "weight" of a given signal line. In contrast with hardware emulated "waves" employed in certain neuromorphic designs, spin waves are employed in this implementation. Relying further on MAMR effect allows for weight adjustment (e.g., as a portion of the magnetization reverses, it substantially affects a line's susceptibility, thus effectively reducing or increasing the amplitude of a signal). Threshold integration of the signal in this implementation is however expected to be at least partially performed by the nodes designated for this purpose, utilizing STOs or other technology.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A machine learning system comprising:
at least one computation circuit configured to perform a weighted summation of incoming signals and provide a resulting signal, the weighted summation being carried out at least in part by a magnetic element, of the computation circuit, in which weights between first and second nodes of a neural network are adjusted based on changes in effective magnetic susceptibility of the magnetic element,
wherein the magnetic element has a first end adjacent to the first node and a second end adjacent to the second node, and
wherein the changes in the effective magnetic susceptibility of the magnetic element are caused at least in part by a change in a magnetization direction in at least a portion of the magnetic element.

2. The machine learning system of claim 1 and wherein the computation circuit comprises input alternating magnetic field generators configured to provide alternating magnetic fields to the magnetic element and thereby generate spin waves within the magnetic element that reverse magnetizations in portions of the magnetic element.

3. The machine learning system of claim 2 and wherein the weighted summation is carried out by interference of the spin waves within the magnetic element, which, in turn, causes the changes in the effective magnetic susceptibility of the magnetic element.

4. The machine learning system of claim 2 and wherein the input alternating magnetic field generators comprise an array of input spin torque oscillators.

5. The machine learning system of claim 2 and wherein the computation circuit further comprises output detectors, which are capable of detecting the changes in the effective magnetic susceptibility of the magnetic element.

6. The machine learning system of claim 5 and wherein the output detectors comprise at least one of an array of output spin torque oscillators, an array of magnetic readers or spin accumulation measurement devices.

7. The machine learning system of claim 5 and wherein the computation circuit further comprises an external field application component configured to alter a magnetization of the magnetic element by application of an external magnetic field to the magnetic element.

8. The machine learning system of claim 7 and wherein computation circuit is configured to be operated in a learning mode and a performance mode.

9. The machine learning system of claim 8 and wherein amplitudes of the spin waves in the performance mode are smaller than the amplitudes of the spin waves in the learning mode.

10. The machine learning system of claim 8 and wherein the performance mode measures scattering of the spin waves towards the output detectors.

11. The machine learning system of claim 8 and wherein the learning mode further comprises:
a boost operation mode in which the magnetization of the magnetic element is reversed to boost scattering of the spin waves towards the output detectors;
an inhibit operation mode in which the magnetization of the magnetic element is reversed to reduce scattering of the spin waves towards the detectors; and
a rehash operation mode in which at least a portion of the magnetization is reset.

12. A method comprising:
performing neural network task processing by adjusting weights between first and second nodes of the neural network based on changes in effective magnetic susceptibility of a magnetic element having a first end adjacent to the first node and a second end adjacent to the second node,
wherein the changes in the effective magnetic susceptibility of the magnetic element are caused at least in part by a change in a magnetization direction in at least a portion of the magnetic element.

13. The method of claim 12 and further comprising providing alternating magnetic fields to the magnetic element to generate spin waves within the magnetic element that reverse magnetizations in portions of the magnetic element, thereby changing the effective magnetic susceptibility of the magnetic element.

14. The method of claim 13 and further comprising detecting the changes in the effective magnetic susceptibility of the magnetic element.

15. The method of claim 13 and further comprising operating the magnetic element in a learning mode and a performance mode.

16. The method of claim 15 and wherein amplitudes of the spin waves in the performance mode are smaller than the amplitudes of the spin waves in the learning mode.

17. The method of claim 15 and wherein the performance mode measures scattering of the spin waves towards output detectors.

18. The method of claim 15 and wherein the learning mode further comprises:
a boost operation mode in which the magnetization of the magnetic element is reversed to boost scattering of the spin waves towards output detectors coupled to the magnetic element;
an inhibit operation mode in which the magnetization of the magnetic element is reversed to reduce scattering of the spin waves towards the detectors; and
a rehash operation mode in which at least a portion of the magnetization is reset.

19. An artificial intelligence processing block comprising:
a magnetic element in which weights are adjusted based on changes in effective magnetic susceptibility of the magnetic element,
wherein the magnetic element comprises a ferromagnetic interconnect between a signal input at a first node of a neural network and a signal output at a second node of a neural network, and
wherein the changes in the effective magnetic susceptibility of the magnetic element are caused at least in part by a change in a magnetization direction in at least a portion of the magnetic element.

20. The artificial intelligence processing block claim 19 and further comprising:

input alternating magnetic field generators of the signal input configured to provide alternating magnetic fields to the magnetic element and thereby generate spin waves within the magnetic element that reverse magnetizations in portions of the magnetic element, which changes in the effective magnetic susceptibility of the magnetic element; and output detectors that are capable of detecting the changes in the effective magnetic susceptibility of the magnetic element.

* * * * *